(12) United States Patent
Gruber (10) Patent No.: US 12,119,812 B2
(45) Date of Patent: Oct. 15, 2024

(54) ELECTRONIC CIRCUIT ARRANGEMENT FOR CURRENT DISTRIBUTION

(71) Applicant: dSPACE GmbH, Paderborn (DE)

(72) Inventor: Paul Gruber, Paderborn (DE)

(73) Assignee: DSPACE GMBH, Paderborn (DE)

( * ) Notice: Subject to any disclaimer, the term of this patent is extended or adjusted under 35 U.S.C. 154(b) by 0 days.

(21) Appl. No.: 18/065,637

(22) Filed: Dec. 14, 2022

(65) Prior Publication Data

US 2023/0198517 A1    Jun. 22, 2023

(30) Foreign Application Priority Data

Dec. 14, 2021  (DE) .......................... 102021132970.1
Dec. 14, 2021  (EP) ..................................... 21214298

(51) Int. Cl.
  *H03K 17/14*  (2006.01)
  *H03K 3/011*  (2006.01)

(52) U.S. Cl.
  CPC ........... *H03K 17/145* (2013.01); *H03K 3/011* (2013.01)

(58) Field of Classification Search
  CPC .... H03K 17/145; H03K 17/164; H03K 3/011; H03K 2017/0806
  See application file for complete search history.

(56) References Cited

U.S. PATENT DOCUMENTS

| | | | | |
|---|---|---|---|---|
| 5,909,108 A * | 6/1999 | He | ...................... | H02M 3/1584 |
| | | | | 323/225 |
| 8,558,587 B2 * | 10/2013 | Machida | .................. | H02M 1/08 |
| | | | | 327/427 |
| 8,829,949 B2 * | 9/2014 | Zajc | .......................... | H03K 4/64 |
| | | | | 327/109 |
| 11,025,243 B2 * | 6/2021 | Bryant | ................... | H03K 17/74 |
| 2013/0002214 A1 | 1/2013 | Chiu | | |
| 2018/0315749 A1 | 11/2018 | Lui et al. | | |

FOREIGN PATENT DOCUMENTS

| | | |
|---|---|---|
| JP | S6198018 A | 5/1986 |
| JP | H09289442 A | 11/1997 |
| WO | WO 2005015741 A2 | 2/2005 |

OTHER PUBLICATIONS

Diverse: "Differential Amplifier", Wikipedia, Dec. 4, 2021 (Dec. 4, 2021), pp. 1-10, XP055925476, Internet, found in internet: URL:https://en.wikipedia.org/w/index.php?title=Differential_amplifier&oldid=1058519695 [retrieved on May 27, 2022].

\* cited by examiner

*Primary Examiner* — Ryan Johnson
*Assistant Examiner* — Colleen J O Toole
(74) *Attorney, Agent, or Firm* — Leydig, Voit & Mayer, Ltd.

(57) ABSTRACT

An electronic circuit for uniform distribution of a current includes: a first MOSFET and a second MOSFET, wherein the first MOSFET and the second MOSFET are connected in parallel in order to distribute a current applied to an input terminal, the current flowing towards an output terminal of the electronic circuit, wherein the input terminal is respectively connected to a drain terminal of the first MOSFET and to a drain terminal of the second MOSFET; and a terminal for a control voltage, wherein the control voltage is applied to a gate terminal of the first MOSFET and to a gate terminal of the second MOSFET. The first MOSFET comprises a first resistor at the gate terminal of the first MOSFET, and the second MOSFET comprises a second resistor at the gate terminal of the second MOSFET.

10 Claims, 4 Drawing Sheets

ELECTRONIC CIRCUIT ARRANGEMENT FOR CURRENT DISTRIBUTION

CROSS-REFERENCE TO PRIOR APPLICATIONS

This application claims benefit to German Patent Application No. DE 102021132970.1 and European Patent Application No. EP21214298.8, filed on Dec. 14, 2021, which are hereby incorporated by reference herein.

FIELD

The invention relates to an electronic circuit arrangement for current distribution. The invention also relates to a method for the uniform distribution of a current, as well as the use of the electronic circuit arrangement in a circuit for simulating a battery.

BACKGROUND

There are many reasons for operating switching elements in parallel. One reason for a parallel connection, for example of transistors, is to achieve an improved cooling. A prerequisite for this is a uniform current distribution.

Figure 1:
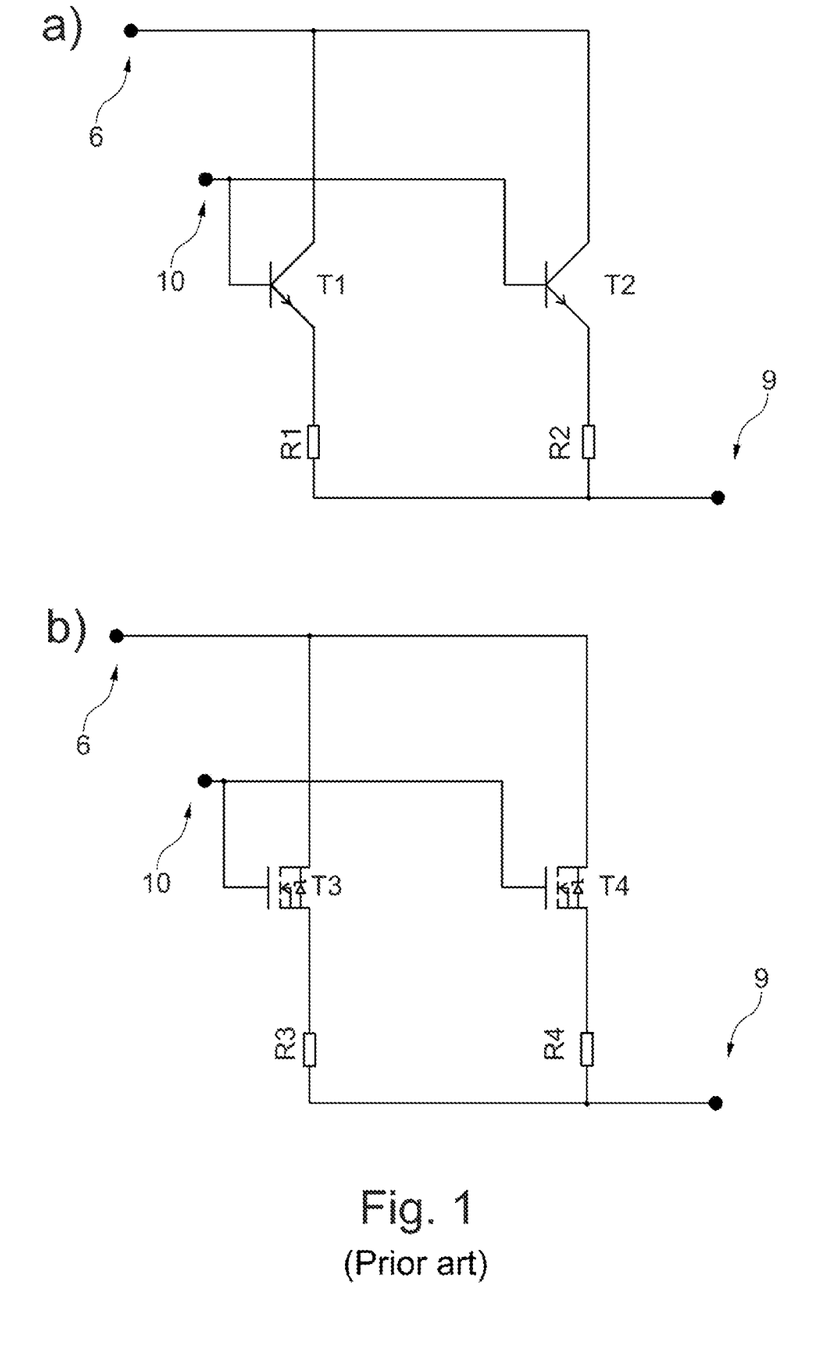
FIG. 1 shows two circuit diagrams of two transistor circuits from the prior art, wherein part a) shows a circuit diagram with two parallel-connected bipolar transistors and part b) shows a circuit diagram with two parallel-connected MOSFETs.

The basic circuits of parallel-connected transistors T1, T2, T3, T4 shown in FIG. 1 are known from the prior art, for example. These circuits are suitable, inter alia, for distributing the power loss a current applied to an input terminal 6, flowing towards an output terminal 9, over a plurality of parallel-connected transistors T1, T2, T3, T4. The electronic circuits shown in parts a) and b) of FIG. 1 respectively have a terminal 10 for a control voltage. However, a parallel connection of transistors for a current distribution always involves the challenge of distributing current or power loss as uniformly as possible so that individual components do not overheat. This is simply feasible in terms of circuitry, for example in that a series resistor R1, R2, R3, R4 is inserted into each emitter or source line. However, this series resistor R1, R2, R3, R4 must be quite large in order to reliably prevent thermal runaway over wide load ranges. However, voltage drops can hereby result which can create an additional power loss and can therefore have a disruptive effect on the current distribution. Applications with low voltages at high currents make current distribution more difficult than, for example, given audio output stages.

SUMMARY

In an exemplary embodiment, the present invention provides an electronic circuit for uniform distribution of a current. The electronic circuit includes: a first MOSFET and a second MOSFET, wherein the first MOSFET and the second MOSFET are connected in parallel in order to distribute a current applied to an input terminal, the current flowing towards an output terminal of the electronic circuit, wherein the input terminal is respectively connected to a drain terminal of the first MOSFET and to a drain terminal of the second MOSFET; and a terminal for a control voltage, wherein the control voltage is applied to a gate terminal of the first MOSFET and to a gate terminal of the second MOSFET. The first MOSFET comprises a first resistor at the gate terminal of the first MOSFET, and the second MOSFET comprises a second resistor at the gate terminal of the second MOSFET. A source terminal of the first MOSFET is connected to a first source resistor and a source terminal of the second MOSFET is connected to a second source resistor. The first source resistor and the second source resistor are connected to the output terminal of the electronic circuit. The electronic circuit further comprises a first transistor and a second transistor. A base of the first transistor is connected to the source terminal of the first MOSFET, and a base of the second transistor is connected to the source terminal of the second MOSFET. An emitter terminal of the first transistor and an emitter terminal of the second transistor are connected to a current source. A collector terminal of the first transistor is connected to the gate terminal of the first MOSFET, and a collector terminal of the second transistor is connected to the gate terminal of the second MOSFET. The first transistor and the second transistor are configured to equalize the current through the first MOSFET and the current through the second MOSFET. The first transistor, in relation to the first MOSFET, and the second transistor, in relation to the second MOSFET, are arranged in the electronic circuit such that a first thermal coupling is established between the first MOSFET and the first transistor and a second thermal coupling is established between the second MOSFET and the second transistor. The first transistor and the second transistor are configured to adjust gate voltages of the first and second MOSFETs based on the first and second thermal couplings.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

In an exemplary embodiment, the present invention provides an electronic circuit in which a plurality of MOSFETs are connected in parallel in order to, in the predominantly linear operation of the MOSFETs, increase the maximum power loss given a uniform distribution of the current. A type of use of the MOSFET in which the MOSFET is not driven to full output by a predefined gate-source voltage is referred to in technical circles, as also in the present context, as a "linear operation", or also as a "linear operating mode", of a MOSFET, or, in other words: In linear operation, for a given drain source current the MOSFET has a significantly higher N-th drain source voltage than—in particular given a MOSFET driven to full output—a minimum M-th drain source voltage that can be achieved for a given drain source current.

According to one aspect, the invention provides an electronic circuit arrangement for the uniform distribution of a current, having a first MOSFET and a second MOSFET, wherein the first MOSFET and the second MOSFET are connected in parallel in order to distribute a current applied to an input terminal, flowing towards an output terminal of the circuit arrangement; wherein the input terminal is respectively connected to the drain terminal of the first MOSFET and to the drain terminal of the second MOSFET; the electronic circuit arrangement comprises a terminal for a control voltage, wherein the control voltage is applied at the gate terminal of the first MOSFET and at the gate terminal of the second MOSFET; the first MOSFET comprises a first resistor at the gate terminal and the second MOSFET comprises a second resistor at the gate terminal; the source terminal of the first MOSFET is connected to a first source resistor and the source terminal of the second MOSFET is connected to a second source resistor, wherein the first source resistor and the second source resistor are connected to the output terminal of the circuit arrangement; characterized in that the circuit arrangement comprises a first transistor, wherein the base of the first transistor is connected to the source terminal of the first MOSFET; the circuit arrangement comprises a second transistor, wherein the base of the second transistor is connected to the source terminal of the second MOSFET, the emitter terminal of the first transistor and the emitter terminal of the second transistor are connected to a current source, the collector terminal of the first transistor is connected to the gate terminal of the first MOSFET, and the collector terminal of the second transistor is connected to the gate terminal of the second MOSFET; wherein the first transistor and the second transistor are configured so as to equalize the current through the first MOSFET and the current through the second MOSFET; the first transistor being arranged in relation to the first MOSFET and the second transistor being arranged in relation to the second MOSFET in the circuit arrangement such that a thermal coupling is established between the first MOSFET and the first transistor, likewise between the second MOSFET and the second transistor; wherein the first transistor and the second transistor are configured so as to adjust the gate voltages of the associated MOSFETs on the basis of the thermal coupling.

Given each MOSFET, a transistor is placed in such a way that the transistor is thermally coupled to the MOSFET. This has the advantage that the transistors also serve as temperature sensors, and not only the current but rather also the temperature between the parallel-connected MOSFETs is equalized. The circuit can thereby operate with very low source resistances, which reduces voltage loss in the state in which they are driven to full output. The maximum power loss given parallel-connected MOSFETs can hereby be increased.

In an advantageous embodiment of the electronic circuit arrangement, the first transistor comprises a first capacitor at the collector terminal and the second transistor comprises a second capacitor at the collector terminal. This has the advantage that the behavior at higher frequencies is improved.

In an advantageous embodiment of the electronic circuit arrangement, the first transistor comprises a first diode at the collector terminal and the second transistor comprises a second diode at the collector terminal. This has the advantage that a clamping of negative gate voltages is avoided. In the present context, the technical term "clamping" (derived from the word "to clamp", meaning "arrest" or "lock" or "pinch" etc.) is to be understood as a process which can occur under predefined boundary conditions within the electronic circuit arrangement according to the invention, and wherein, at the first MOSFET and/or at the second MOSFET, the respective applied gate source voltage(s) is/are limited by control circuit(s) surrounding the MOSFET(s) to an extent unintended for the application according to the present disclosure.

In an advantageous embodiment of the electronic circuit arrangement, the first transistor comprises a third resistor at the emitter terminal and the second transistor comprises a fourth resistor at the emitter terminal. This has the advantage that the third resistance and the fourth resistance, somewhat linearizes the intrinsically exponential voltage-current characteristic of the base emitter path from the first transistor and the second transistor. The effectiveness of the correction can hereby be metered.

In an advantageous embodiment of the electronic circuit arrangement, the first transistor and the second transistor are bipolar transistors.

In an advantageous embodiment of the electronic circuit arrangement, the first MOSFET and the first transistor are thermally connected to one another via a thermally conductive medium, likewise the second MOSFET and the second transistor. The thermal coupling between the transistors can be ensured via a thermally conductive medium.

In an advantageous embodiment of the electronic circuit arrangement, the thermally conductive medium is a conductor trace on a common circuit board.

In an advantageous embodiment of the electronic circuit arrangement, more than two MOSFETs are connected in parallel. The present invention is not limited to two parallel-connected MOSFETs. A plurality of MOSFETs can be connected in parallel and, via the circuit arrangement according to the invention, the maximum power loss can be increased.

In an advantageous embodiment of the electronic circuit arrangement, the electronic circuit arrangement comprises a second electronic circuit arrangement, wherein the second electronic circuit arrangement corresponds to a mirroring of the first electronic circuit arrangement; wherein, in the mirrored second electronic circuit arrangement, the dopings of the transistors are reversed, the forward direction of diodes is reversed, and the voltages and currents are negated; wherein the first electronic circuit arrangement and the second electronic circuit arrangement comprises a common output terminal with common source resistors, or a common output terminal with separate source resistors for the first electronic circuit arrangement and the second electronic circuit arrangement.

According to a further aspect, the invention provides a method for the uniform distribution of a current, the method comprising the following steps:

providing an electronic circuit arrangement with features described above, equalization of a current, applied at the input terminal and flowing towards an output terminal, via the first MOSFET and the second MOSFET, wherein the gate voltage of the first MOSFET is adjusted via the first transistor and the gate voltage of the second MOSFET is adjusted via the second transistor; wherein, via a thermal coupling between the first MOSFET and the first transistor and a thermal coupling between the second MOSFET and the second transistor, the current is additionally balanced in the event of an inequality of the temperature between the first MOSFET and the second MOSFET.

The invention also relates to the use of the previously described electronic circuit arrangement for the uniform distribution of a current and a temperature-dependent balancing of the current according to the method in a circuit for simulating a battery. The invention is helpful when several MOSFETs are connected in parallel, in order to increase the maximum power loss during linear operation. This can be used, for example, given a battery cell simulation board. A simulated battery cell can thereby both emit energy and receive it. In the latter event, this energy is converted into heat in the simulator.

FIG. 1 shows two circuit diagrams of two transistor circuits from the prior art, and have already been discussed above.

Figure 2:
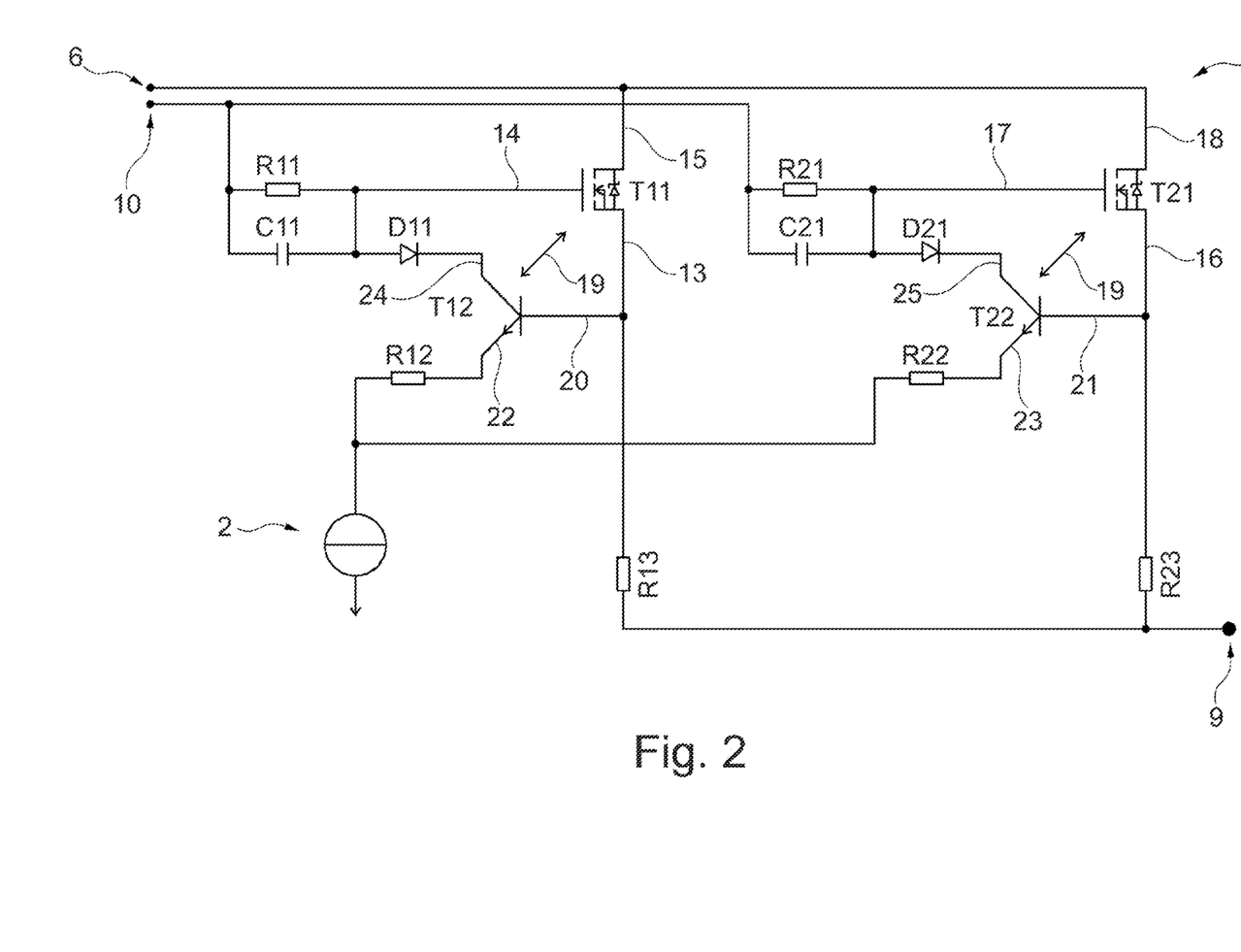
FIG. 2 shows a circuit diagram of an electronic circuit arrangement for the distribution of a current according to an exemplary embodiment of the invention.

FIG. 2 shows a circuit diagram of an electronic circuit arrangement 1 for the uniform distribution of a current according to a first exemplary embodiment of the invention. The current flowing from an input terminal 6 of the circuit is distributed to an output terminal 9 of the circuit over the MOSFETs T11 and T21. For the sake of simplicity, only two parallel-connected MOSFETs T11 and T21 are shown in the exemplary embodiment shown in FIG. 2. However, these principles can be extended to more than two parallel-connected MOSFETs. Each of the MOSFETs T11, T21 shown in FIG. 2 has a source resistor R13 or R23, respectively, and a transistor T12 or T22, respectively. The transistors T12, T22 are thereby placed in such a way, with respect to their respective MOSFETs T11, T21, that the transistors T12, T22 can track the temperature of the respective MOSFETs T11, T21 optimally well. This is ensured by a thermal coupling between the first MOSFET T11 and the first transistor T12, and a thermal coupling 19, likewise between the second MOSFET T21 and the second transistor T22. In one exemplary embodiment of the invention, a thermally conductive medium is provided for the thermal coupling 19. For example, conductor traces of a jointly utilized circuit board can be used as a thermally conductive medium. The emitter terminal 22 of the first transistor T12 and the emitter terminal 23 of the second transistor T22 are connected to a current source 2. The current source 2 is, for example, dimensioned to 1 mA per MOSFET T11, T21, so that on average there is a drop of barely 1V over the resistors R11, R21. The control voltage 10 is therefore approximately 1V higher than the mean value of the gate voltages. Ideally, exactly half of the total current flows through the resistors R13 and R23, respectively. Identical current and voltage ratios are thereby also present at R12/R22, T12/T22, and R11/R21. Furthermore, in the ideal instance T11 and T21 as well as T12 and T22 have the same temperature. If the balance is now disturbed, e.g., T11 is loaded more due to part variance, the base voltage of T12 increases. This also increases the current through R12 and R11, while the current through R22 and R21 decreases. The gate voltage decreases at T11 and rises at T21, and the current is thus equalized by T11 and T21. This equalization will not be perfect, but rather corresponds to a P-control behavior with a relatively low gain. Now, unequal currents through T11 and T21 will also lead to unequal temperatures, which are also transmitted to T12 and T22. The base emitter voltage of T12 or T22 decreases by approximately 2.1 mV/K upon heating. This in turn leads to a lowering of the gate voltage of the associated MOSFETs T11, T21, and thus to a relief. The circuit arrangement 1 therefore balances not only the current between parallel-connected MOSFETs T11, T21 but rather, above all, the temperature. This is particularly useful if a MOSFET T11, T21 has a poorer connection, for example to a heat sink. Instead of the thermal runaway that is otherwise to be feared, this MOSFET is specifically relieved by the electronic circuit arrangement 1. For example, in one exemplary embodiment, five parallel-connected MOSFETs T11, T21, . . . can be provided for a total of 20 A nominal current. The resistors R13 and R23 can be dimensioned, for example, with 15 mΩ Ideally, each MOSFET T11, T21 carries 4 A, and at the resistors R13, R23 there is a drop of 60 mV. If one of the transistors T12, T22 is now warmer by 10° C., its base emitter voltage reduces by 21 mV, which in a first approximation brings about a relief of a good 1 A at the MOSFETs T11, T21. The capacitors C11, C21, shown in FIG. 2 at the collector terminal 24 of the first transistor T12 and at the collector terminal 25 of the second transistor T22, improve the behavior at higher frequencies. The diodes D11 and D21 prevent the "clamping" (see the above explanation of the term) of negative gate voltages. The resistors R12 and R22 somewhat linearize the exponential voltage-current characteristic curve of the base emitter path T12 or T22. They thus also allow the effectiveness of the correction to be metered.

Figure 3:
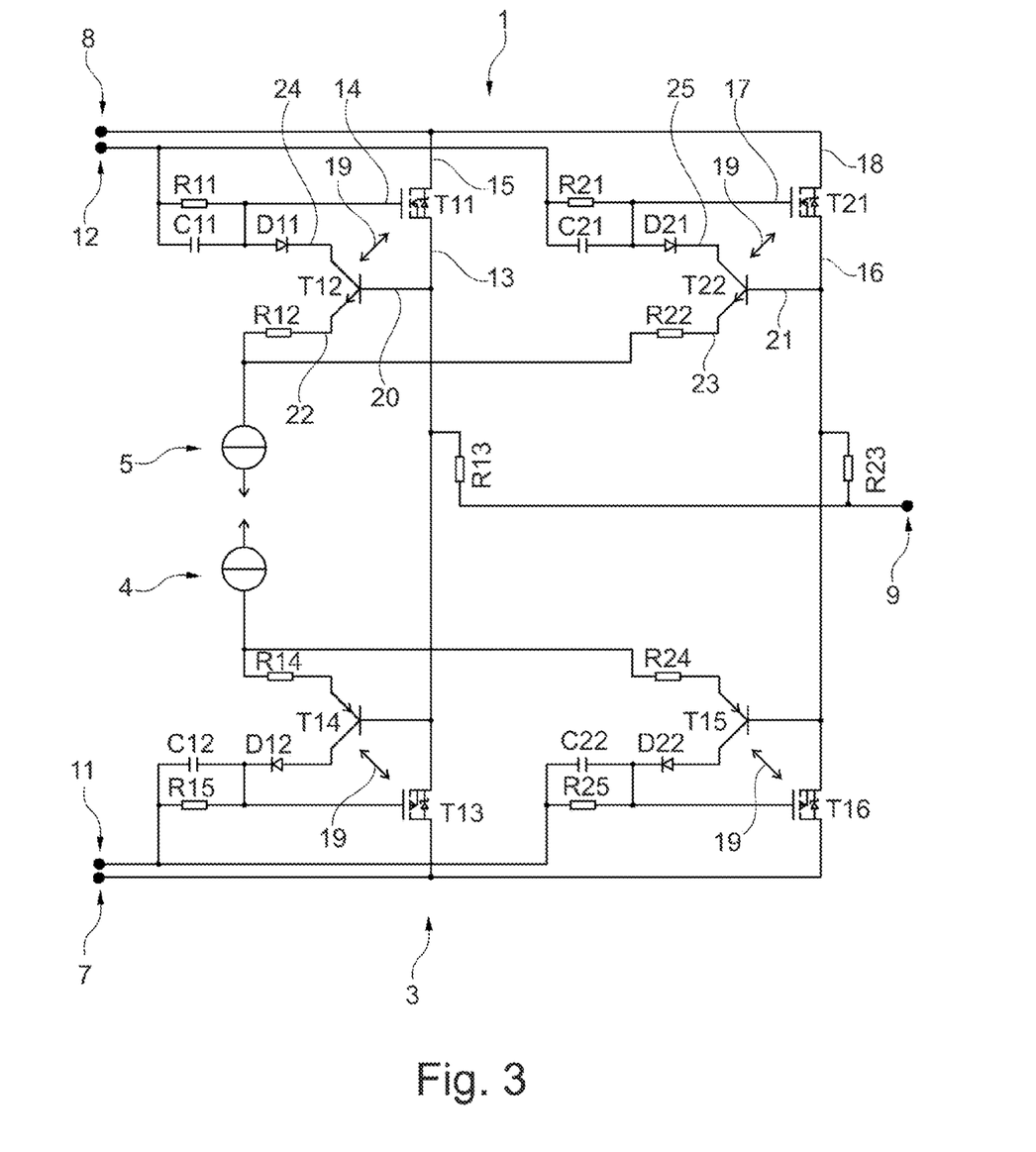
FIG. 3 shows a circuit diagram of an electronic circuit arrangement for the distribution of a current according to a further exemplary embodiment of the invention.

FIG. 3 shows a circuit diagram of an electronic circuit arrangement 1 for distributing a current according to a further exemplary embodiment of the invention. The electronic circuit arrangement 1 shown in FIG. 2 is depicted mirrored in the exemplary embodiment shown in FIG. 3. In this context, mirrored means that a second electronic circuit arrangement 3 is provided, wherein NPN transistors are exchanged for PNP transistors and N MOSFETs are exchanged for P MOSFETs, diodes are reversed, and voltages and currents are negated. Shown in FIG. 3 is the combination of the circuit arrangement of FIG. 2 and the mirrored circuit 3, in each instance with two parallel-connected MOSFETs T11, T21, T13, T16. The circuit arrangement 1, 3 shown in FIG. 3 comprises an input terminal 7 as well as a control terminal 11 for a negative branch of the circuit arrangement 3, and an input terminal 8 and a control terminal 12 for a positive branch of the circuit arrangement 1. In the exemplary embodiment shown in FIG. 3, the negative and positive branches use common source resistors R13, R23. In one exemplary embodiment, it can also be provided that the first electronic circuit arrangement 1 and the second electronic circuit arrangement 3 have a common output terminal 9 with separate source resistors R13, R23 for the first electronic circuit arrangement 1 and the second electronic circuit arrangement 3. The negative and the positive branch respectively comprise a current source 4, 5. The current sources 4, 5 are supplied from voltages which must sufficiently exceed the voltage at the output terminal 9, for example relative to the input terminal 7, 8. For the balancing, the current sources 4, 5 must be sufficient to reliably cover and the adjustment range of the gate voltages. "Sufficiently" or "sufficient" thereby means that the current source (4) is fed from so high a positive voltage, and the current source (5) is fed from a negative voltage which is so large in terms of magnitude, that, for each voltage to be output at the output (9), with all expected variances of the components, the state is achievable in which all MOSFETs are in the M-th state, i.e. the MOSFETs can be driven to full output.

Figure 4:
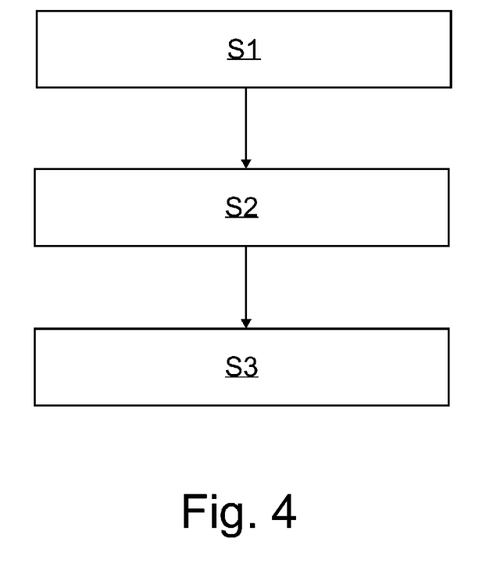
FIG. 4 shows a flowchart of a method for the uniform distribution of a current according to an exemplary embodiment of the invention.

FIG. 4 shows a flowchart of a method for the uniform distribution of a current according to an exemplary embodiment of the invention. The method starts in step S1 with the provision of an electronic circuit arrangement 1 as described above. In step S2, a current applied to the input terminal 6, said current flowing towards an output terminal 9, is equalized via the first MOSFET T11 and the second MOSFET T21. The gate voltage 14 of the first MOSFET T11 is thereby adjusted via the first transistor T12, and the gate voltage 17 of the second MOSFET T21 is adjusted via the second transistor T22. In step S3, due to the thermal coupling 19 between the first MOSFET T11 and the first transistor T12 and the thermal coupling 19 between the second MOSFET T21 and the second transistor T22, the current is additionally balanced given an inequality of the temperature between the first MOSFET T11 and the second MOSFET T21.

All features explained in conjunction with individual embodiments of the invention can be provided in different combinations in the subject matter according to the invention in order to simultaneously realize their advantageous effects, even if they have been described with respect to different embodiments.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

Electronic circuit arrangement 1
Power source 2
Second electronic circuit arrangement 3
Current source, negative branch 4
Current source, positive branch 5
Input terminal 6
Input terminal, negative branch 7
Input terminal, positive branch 8
Output terminal 9
Control terminal 10
Control terminal, negative branch 11
Control terminal, positive branch 12
Source terminal, first MOSFET 13
Gate terminal, first MOSFET 14
Drain terminal, first MOSFET 15
Source terminal, second MOSFET 16
Gate terminal, second MOSFET 17
Drain terminal, second MOSFET 18
Thermal coupling 19
Base of first transistor 20
Base of second transistor 21
Emitter terminal, first transistor 22
Emitter terminal, second transistor 23
Collector terminal, first transistor 24
Collector terminal, second transistor 25
Resistor R1
Resistor R2
Bipolar transistor T1
Bipolar transistor T2
Resistor R3
Resistor R4
MOSFET T3
MOSFET T4
First resistor R11
Third resistor R12
Source resistor R13
Resistor R14
Resistor R15
Second resistor R21
Fourth resistor R22
Source resistor R23
Resistor R24
Resistor R25
Diode D11
Diode D12
Diode D21
Diode D22
Capacitor C11
Capacitor C12
Capacitor C21
Capacitor C22
First MOSFET T11
First bipolar transistor T12
Third MOSFET T13
Third bipolar transistor T14
Fourth bipolar transistor T15
Fourth MOSFET T16
Second MOSFET T21
Second bipolar transistor T22
Providing an electronic circuit arrangement S1
Equalizing a current S2
Balancing a temperature S3

The invention claimed is:

1. An electronic circuit for uniform distribution of a current, comprising:
a first MOSFET and a second MOSFET, wherein the first MOSFET and the second MOSFET are connected in parallel in order to distribute a current applied to an input terminal, the current flowing towards an output terminal of the electronic circuit, wherein the input terminal is respectively connected to a drain terminal of the first MOSFET and to a drain terminal of the second MOSFET; and
a terminal for a control voltage, wherein the control voltage is applied to a gate terminal of the first MOSFET and to a gate terminal of the second MOSFET;
wherein the first MOSFET comprises a first resistor at the gate terminal of the first MOSFET, and the second MOSFET comprises a second resistor at the gate terminal of the second MOSFET;
wherein a source terminal of the first MOSFET is connected to a first source resistor and a source terminal of the second MOSFET is connected to a second source resistor, wherein the first source resistor and the second source resistor are connected to the output terminal of the electronic circuit;
wherein the electronic circuit further comprises a first transistor and a second transistor, wherein a base of the first transistor is connected to the source terminal of the first MOSFET, and a base of the second transistor is connected to the source terminal of the second MOSFET;

wherein an emitter terminal of the first transistor and an emitter terminal of the second transistor are connected to each other and to a current source, wherein the current source is dimensioned to a predetermined amount of current per MOSFET in the electronic circuit so as to limit a voltage drop over each of the first and second resistors;

wherein a collector terminal of the first transistor is connected to the gate terminal of the first MOSFET, and a collector terminal of the second transistor is connected to the gate terminal of the second MOSFET;

wherein the first transistor and the second transistor are configured to equalize the current through the first MOSFET and the current through the second MOSFET;

wherein the first transistor, in relation to the first MOSFET, and the second transistor, in relation to the second MOSFET, are arranged in the electronic circuit such that a first thermal coupling is established between the first MOSFET and the first transistor and a second thermal coupling is established between the second MOSFET and the second transistor;

wherein the first transistor and the second transistor are configured to adjust gate voltages of the first and second MOSFETs based on the first and second thermal couplings.

2. The electronic circuit according to claim 1, wherein the first transistor at its collector terminal comprises a first capacitor, and the second transistor at its collector terminal comprises a second capacitor.

3. The electronic circuit according to claim 1, wherein the first transistor at its collector terminal comprises a first diode, and the second transistor at its collector terminal comprises a second diode.

4. The electronic circuit according to claim 1, wherein the first transistor at its emitter terminal comprises a third resistor, and the second transistor at its emitter terminal comprises a fourth resistor.

5. The electronic circuit according to claim 1, wherein the first transistor and the second transistor are bipolar transistors.

6. The electronic circuit according to claim 1, wherein the first MOSFET and the first transistor are thermally connected to one another via a first thermally conductive medium, and wherein the second MOSFET and the second transistor are thermally connected to one another via a second thermally conductive medium.

7. The electronic circuit according to claim 6, wherein the first and second thermally conductive mediums are conductor traces of a common circuit board.

8. The electronic circuit according to claim 1, wherein more than two MOSFETs are connected in parallel.

9. A system, comprising a first electronic circuit and a second electronic circuit, wherein the first electronic circuit comprises:

a first MOSFET and a second MOSFET, wherein the first MOSFET and the second MOSFET are connected in parallel in order to distribute a current applied to an input terminal, the current flowing towards an output terminal of the electronic circuit, wherein the input terminal is respectively connected to a drain terminal of the first MOSFET and to a drain terminal of the second MOSFET; and a terminal for a control voltage, wherein the control voltage is applied to a gate terminal of the first MOSFET and to a gate terminal of the second MOSFET;

wherein the first MOSFET comprises a first resistor at the gate terminal of the first MOSFET, and the second MOSFET comprises a second resistor at the gate terminal of the second MOSFET;

wherein a source terminal of the first MOSFET is connected to a first source resistor and a source terminal of the second MOSFET is connected to a second source resistor, wherein the first source resistor and the second source resistor are connected to the output terminal of the electronic circuit;

wherein the electronic circuit further comprises a first transistor and a second transistor, wherein a base of the first transistor is connected to the source terminal of the first MOSFET, and a base of the second transistor is connected to the source terminal of the second MOSFET;

wherein an emitter terminal of the first transistor and an emitter terminal of the second transistor are connected to each other and to a current source, wherein the current source is dimensioned to a predetermined amount of current per MOSFET in the electronic circuit so as to limit a voltage drop over each of the first and second resistors;

wherein a collector terminal of the first transistor is connected to the gate terminal of the first MOSFET, and a collector terminal of the second transistor is connected to the gate terminal of the second MOSFET;

wherein the first transistor and the second transistor are configured to equalize the current through the first MOSFET and the current through the second MOSFET;

wherein the first transistor, in relation to the first MOSFET, and the second transistor, in relation to the second MOSFET, are arranged in the electronic circuit such that a first thermal coupling is established between the first MOSFET and the first transistor and a second thermal coupling is established between the second MOSFET and the second transistor;

wherein the first transistor and the second transistor are configured to adjust gate voltages of the first and second MOSFETs based on the first and second thermal couplings;

wherein the second electronic circuit corresponds to a mirroring of the first electronic circuit, wherein, in the mirrored second electronic circuit arrangement, the dopings of the transistors are reversed, the forward directions of diodes are reversed, and the voltages and currents are negated;

wherein the first electronic circuit and the second electronic circuit have a common output terminal with common source resistors, or a common output terminal with separate source resistors for the first electronic circuit and the second electronic circuit.

10. A method for uniform distribution of a current, the method comprising:

providing an electronic circuit; and equalizing a current applied at an input terminal, the current flowing towards an output terminal, via a first MOSFET and a second MOSFET, wherein a gate voltage of the first MOSFET is adjusted via a first transistor, and a gate voltage of the second MOSFET is adjusted via a second transistor;

wherein, via a first thermal coupling between the first MOSFET and the first transistor and a second thermal coupling between the second MOSFET and the second transistor, the current is balanced in the event of an inequality of temperature between the first MOSFET and the second MOSFET;

wherein a base of the first transistor is connected to a source terminal of the first MOSFET, and a base of the second transistor is connected to a source terminal of the second MOSFET; and wherein an emitter terminal of the first transistor and an emitter terminal of the second transistor are connected to each other and to a current source, wherein the current source is dimensioned to a predetermined amount of current per MOSFET in the electronic circuit so as to limit a voltage drop over each of first and second resistors at gate terminals of the first and second MOSFETs.

* * * * *